United States Patent
Tan et al.

(10) Patent No.: US 10,424,385 B1
(45) Date of Patent: Sep. 24, 2019

(54) SELF-CONFIGURING INTEGRATED CIRCUIT DEVICE

(71) Applicant: Dell Products L. P., Round Rock, TX (US)

(72) Inventors: Geroncio Ong Tan, Austin, TX (US); Lip Vui Kan, Hillbrooks (SG)

(73) Assignee: Dell Products L. P., Round Rock, TX (US)

(*) Notice: Subject to any disclaimer, the term of this patent is extended or adjusted under 35 U.S.C. 154(b) by 0 days.

(21) Appl. No.: 16/114,364

(22) Filed: Aug. 28, 2018

(51) Int. Cl.
*G11C 5/14* (2006.01)
*G11C 16/30* (2006.01)
*G05F 1/625* (2006.01)
*G06F 1/26* (2006.01)

(52) U.S. Cl.
CPC .............. *G11C 16/30* (2013.01); *G11C 5/143* (2013.01); *G05F 1/625* (2013.01); *G06F 1/26* (2013.01)

(58) Field of Classification Search
CPC ......... G11C 16/30; G11C 5/143; G06F 1/625; G06F 1/26
USPC ...................................... 365/189.09, 226, 63
See application file for complete search history.

(56) References Cited

U.S. PATENT DOCUMENTS

| | | | | |
|---|---|---|---|---|
| 10,120,434 | B2* | 11/2018 | Pihet | G06F 1/3287 |
| 2006/0291322 | A1* | 12/2006 | Crippa | G11C 7/04 |
| | | | | 365/230.06 |
| 2006/0294437 | A1* | 12/2006 | Washburn | G06F 1/26 |
| | | | | 714/42 |
| 2008/0054864 | A1* | 3/2008 | Crippa | G05F 1/565 |
| | | | | 323/269 |
| 2012/0030483 | A1* | 2/2012 | Kung | G06F 1/26 |
| | | | | 713/300 |
| 2013/0106501 | A1* | 5/2013 | Yoo | G05F 1/56 |
| | | | | 327/538 |
| 2013/0241285 | A1* | 9/2013 | Shieh | H02M 3/04 |
| | | | | 307/31 |
| 2014/0372776 | A1* | 12/2014 | Yang | G06F 1/26 |
| | | | | 713/300 |
| 2015/0145337 | A1* | 5/2015 | Lee | G05F 1/625 |
| | | | | 307/52 |
| 2015/0326119 | A1* | 11/2015 | Hung | H02M 3/157 |
| | | | | 327/540 |
| 2016/0233770 | A1* | 8/2016 | Arakawa | H02M 3/158 |
| 2018/0210540 | A1* | 7/2018 | Wang | G11C 13/0038 |
| 2019/0041934 | A1* | 2/2019 | Tan | G06F 1/263 |

* cited by examiner

*Primary Examiner* — Viet Q Nguyen
(74) *Attorney, Agent, or Firm* — Campbell Stephenson LLP; Shiv S. Naimpally

(57) ABSTRACT

In some examples, a circuit includes (1) a voltage regulator, (2) a voltage divider that includes a first resistor, a second resistor, and a third resistor, and (3) a device that includes a first pin, a second pin, and a third pin. In the device, when the first pin is connected to the first resistor and to a ground (the second and third pin are unconnected), a voltage input of the device receives a first voltage from the voltage regulator. When the second pin is connected to the second resistor and to the ground (the first and third pin are unconnected), the voltage input receives a second voltage from the voltage regulator. When the third pin is connected to the third resistor and to the ground (the first and second pin are unconnected), the voltage input receives a third voltage from the voltage regulator.

20 Claims, 4 Drawing Sheets

SELF-CONFIGURING INTEGRATED CIRCUIT DEVICE

BACKGROUND OF THE INVENTION

Field of the Invention

This invention relates generally to circuits and more particularly to a circuit that, when a device, such as an integrated circuit (IC), is placed in the circuit, the device automatically configures itself, for example, to receive an amount of power used by the device.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In the quest for miniaturization, solid state drive (SSD) vendors have opted to leave voltage regulators outside of the SSD, which adds design complexity. For example, regardless of the memory used in a next generation form factor (NGFF) memory module, a single 3.3V (volt) supply is provided, which each vendor down-converts to a voltage appropriate for the SSD devices used in the memory module. However, each vendor may use a different voltage for a ball grid array (BGA) SSD, a type of memory device chip (e.g., integrated circuit). For example, the SSD specification may provide for three different voltage rails. A first vendor may design a first device to use a first voltage rail (e.g., 3.3V or 2.5V), a second vendor may design a second device to use a second voltage rail (e.g., 1.8V or 1.2V), and a third vendor may design a third device to use a third voltage rail (e.g., 1.2V, 1.1V, or 0.9V). Vendors who manufacture dynamic random-access memory (DRAM) may prefer to incorporate local DRAM into the BGA SSD, whereas non-DRAM manufacturers may prefer to use host memory buffer (HMB), a feature of non-volatile memory express (NVMe) that reserves a small portion of system DRAM for the exclusive use of a device. DRAM logic circuitry uses 1.8V, so vendors who prefer to build using DRAM may design devices to use 1.8V. In contrast, vendors who use HMB may design devices to use 1.2V.

To accommodate multiple vendors that each use a different voltage for a particular type of device, a manufacturer of computer motherboards may design and stock multiple different motherboards. For example, for BGA SSDs, the manufacturer may create a first motherboard for a first device of a first SSD vendor, a second motherboard for a second device of a second SSD vendor, and a third motherboard for a third device of a third SSD vendor. However, such an arrangement is costly and inefficient.

SUMMARY OF THE INVENTION

This Summary provides a simplified form of concepts that are further described below in the Detailed Description. This Summary is not intended to identify key or essential features and should therefore not be used for determining or limiting the scope of the claimed subject matter.

In some examples, a circuit may include (1) a voltage regulator, (2) a voltage divider connected to the voltage regulator, and (3) a device (e.g., memory device). The voltage divider may include a first resistor, a second resistor, and a third resistor. The device may include multiple pins, including at least a first pin, a second pin, and a third pin. The device may be manufactured by at least three different suppliers (e.g., vendors). In a first device associated with a first supplier, the first pin is connected to the first resistor and to a ground of the circuit (e.g., the second pin and the third pin are unconnected). When the first device is connected to the circuit, a voltage input of the device may receive a first voltage from the voltage regulator. In a second device associated with a second supplier, the second pin is connected to the second resistor and to the ground (e.g., the first pin and the third pin are unconnected). When the second device is connected to the circuit, the voltage input of the device may receive a second voltage from the voltage regulator. In a third device associated with a third supplier, the third pin is connected to the third resistor and to the ground (e.g., the first pin and the second pin are unconnected). When the third device is connected to the circuit, the voltage input of the device may receive a third voltage from the voltage regulator.

BRIEF DESCRIPTION OF THE DRAWINGS

A more complete understanding of the present disclosure may be obtained by reference to the following Detailed Description when taken in conjunction with the accompanying Drawings. In the figures, the left-most digit(s) of a reference number identifies the figure in which the reference number first appears. The same reference numbers in different figures indicate similar or identical items.

DETAILED DESCRIPTION

Figure 1:
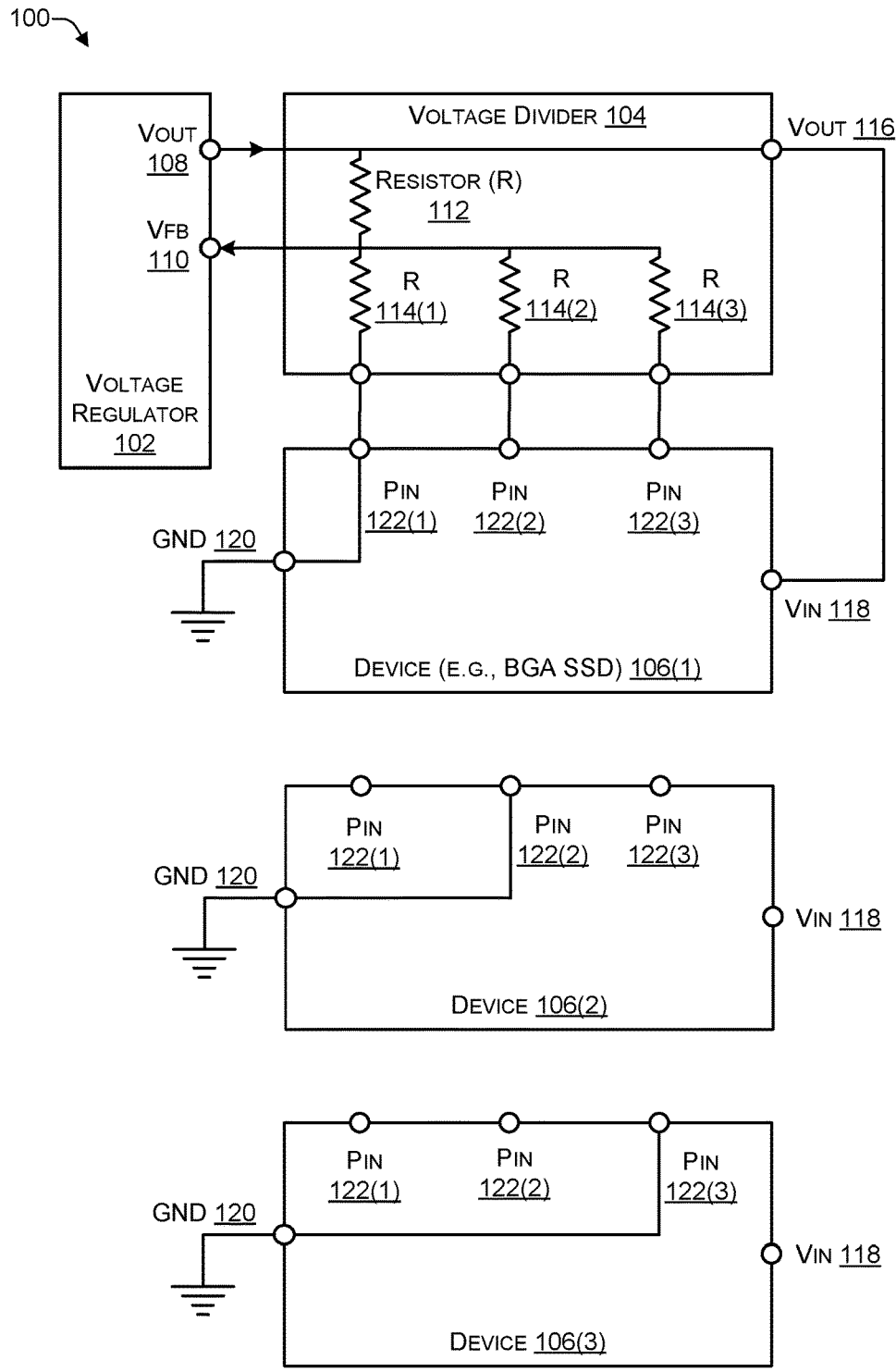
FIG. 1 is a block diagram of a circuit that includes a device that automatically receives an appropriate amount of voltage, according to some embodiments.

For purposes of this disclosure, an information handling system (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or video display. The information handling system may also include one or more buses operable to transmit communications between the various hardware components.

The systems and techniques described herein enable a vendor to create a device that configures itself to receive an appropriate signal, such as an appropriate amount of voltage. For example, assume there are three vendors of a particular integrated circuit (IC) device ("device"), such as a ball grid array (BGA) solid state drive (SSD) device, and assume each vendor uses a different voltage. In this example, three pins, e.g., a first pin, a second pin, and a third pin, on the device are reserved for configuring a voltage that the device is to receive. The first vendor designs and manufactures a first device in which the first pin is connected to ground while the second pin and third pin are unused (e.g., also referred to as unconnected or floating). The second vendor designs and manufactures a second device in which the second pin is connected to ground while the first pin and third pin are unused. The third vendor designs and manufactures a third device in which the third pin is connected to ground while the first pin and second pin are unused. A manufacturer may design a circuit (e.g., a motherboard) that includes a voltage regulator with a voltage divider network having three different resistors that provide three different voltages. When the first device is placed in the circuit, the grounded first pin causes the first device to automatically receive a first voltage from the voltage divider. When the second device is placed in the circuit, the grounded second pin causes the second device to automatically receive a second voltage from the voltage divider. When the third device is placed in the circuit, the grounded third pin causes the third device to automatically receive a third voltage from the voltage divider. In this way, each vendor's device may ground a different pin of the multiple pins, causing each vendor's device to automatically receive the appropriate amount of voltage from the voltage regulator via the voltage divider.

While the examples provided herein use three devices manufactured by three vendors using three different voltages, in other implementations the techniques and systems described herein may be used with fewer devices (e.g., two devices by two vendors) or more devices (e.g., more than three devices from more than three vendors). In addition, while the examples are illustrated using a voltage regulator that provides a particular voltage to each device, the systems and techniques described herein may be used to have a device placed in a circuit to configure itself to receive a particular protocol of multiple protocols, e.g., receive either a universal asynchronous receiver-transmitter (UART) protocol or an Inter-Integrated Circuit (I2C) protocol. Further, while the examples are illustrated using grounding a particular pin of multiple pins to receive a particular voltage, the systems and techniques may be applied to using the pins in a different manner to configure the device. For example, if a first pin receives a voltage while a second pin does not, the device may configure itself to a first configuration while if the second pin receives the voltage while the first pin does not, the device may configure itself to a second configuration. As another example, if a first pin receives a first voltage, the device may configure itself to a first configuration while if the first pin receives a second voltage (e.g., different from the first voltage), the device may configure itself to a second configuration.

As a first example, a computing device may include a circuit, such as the circuit of a motherboard of the computing device. The circuit may include (1) a voltage regulator and (2) a voltage divider connected to the voltage regulator. The voltage divider may include at least a first resistor, a second resistor, and a third resistor.

A first device (e.g., provided by a first vendor) may include a plurality of pins, including a first pin, a second pin, and a third pin. In the first device, the first pin of the plurality of the pins may be connected to the first resistor and to a ground of the circuit. The second pin and the third pin may be unconnected (e.g., floating). Connecting the first device to the circuit may cause a voltage input of the first device to receive a first voltage from the voltage regulator. For example, the first resistor may have a resistance of about 100 kilo ohms and the first voltage may be about 1.2 volts.

A second device (e.g., provided by a second vendor) may include the plurality of pins. In the second device, the second pin may be connected to the second resistor and to the ground of the circuit. The first pin and the third pin may be unconnected. When the second device is connected to the circuit, the voltage input of the second device may receive a second voltage from the voltage regulator, where the second voltage is different from the first voltage. For example, the second resistor may have a resistance of about 120 kilo ohms and the second voltage may be about 1.1 volts.

A third device (e.g., provided by a third vendor) may include the plurality of pins. In the third device, the third pin may be connected to the third resistor and to the ground of the circuit. The first pin and the second pin may be unconnected. When the third device is connected to the circuit, the voltage input of the third device may receive a third voltage from the voltage regulator, where the third voltage is different from the first voltage and the second voltage. For example, the third resistor may have a resistance of about 200 kilo ohms and the third voltage may be about 0.9 volts. At least one of the first device, the second device, or the third device may include a memory device, such as, for example, a ball grid array (BGA) solid state drive (SSD).

As a second example, a circuit may include a voltage regulator, a voltage divider, and a device. For example, the circuit may be a motherboard of a computing device. The device may, in some cases, be a memory device, such as, for example, a ball grid array (BGA) solid state drive (SSD). The voltage regulator may include a voltage output and a feedback input. The voltage divider may be coupled to the voltage regulator. The voltage divider may include a resistor and a plurality of additional resistors. In the circuit, a first connection of the resistor is coupled to the voltage output, a second connection of the resistor is coupled to the feedback input of the voltage regulator, and a first connection of each of the plurality of additional resistors is coupled to the feedback input of the voltage regulator. The device may include a ground pin externally coupled to a ground of the circuit, a voltage input pin externally coupled to the voltage output of the voltage regulator, and a plurality of additional pins. Each pin of the plurality of additional pins is externally coupled to a second connection of a corresponding resistor of the plurality of additional resistors. The device is configured internally (e.g., depending on the vendor of the device) to couple the ground pin to a particular pin of the plurality of additional pins. For example, a first device (e.g., associated with a first vendor) may be configured internally to couple the ground pin to a first pin of the plurality of additional pins to receive a first voltage, with at least a second pin and a third pin of the plurality of pins unconnected internally. A second device (e.g., associated with a second vendor) may be configured internally to couple the ground pin to the second pin of the plurality of additional pins to receive a second voltage (e.g., different from the first voltage), with at least the first pin and the third pin of the plurality of pins unconnected internally. A third device (e.g., associated with a third vendor) may be configured internally to couple the ground pin to the third pin of the plurality of additional pins to receive a third voltage (e.g., different from both the first voltage and the second voltage), with at least a first pin and a second pin of the plurality of pins unconnected internally.

As a third example, a motherboard may include one or more processors, a voltage regulator comprising a voltage output and a feedback input, a voltage divider coupled to the voltage regulator, and a memory device. The voltage divider may include a resistor and a plurality of additional resistors. A first connection of the resistor is coupled to the voltage output, a second connection of the resistor is coupled to the feedback input of the voltage regulator, and a first connection of each of the plurality of additional resistors is coupled to the feedback input of the voltage regulator. The memory device includes a ground pin externally coupled to a ground of the circuit, a voltage input pin externally coupled to the voltage output of the voltage regulator, and a plurality of additional pins. Each pin of the plurality of additional pins is externally coupled to a second connection of a corresponding resistor of the plurality of additional resistors. The memory device is configured internally to couple the ground pin to a particular pin of the plurality of additional pins and at least one pin of the plurality of additional pins is unconnected internally. For example, the memory device of a first vendor may be configured internally to couple the ground pin to a first pin of the plurality of additional pins to receive a first voltage at the voltage input pin from the voltage regulator. A first resistor of the plurality of resistors may have a resistance of about 100 kilo ohms and the first voltage may be about 1.2 volts. The memory device of a second vendor may be configured internally to couple the ground pin to a second pin of the plurality of additional pins to receive a second voltage at the voltage input pin from the voltage regulator. A second resistor of the plurality of resistors may have a resistance of about 120 kilo ohms and the second voltage may be about 1.1 volts. The memory device of a third vendor may be configured internally to couple the ground pin to a third pin of the plurality of additional pins to receive a third voltage at the voltage input pin from the voltage regulator.

As a fourth example, a circuit board may include a voltage regulator having a voltage output and a feedback input, a voltage divider coupled to the voltage regulator, and a device. The voltage divider may include a resistor and a plurality of additional resistors. A first connection of the resistor is coupled to the voltage output and a second connection of the resistor is coupled to the feedback input of the voltage regulator. A first connection of each of the plurality of additional resistors is coupled to the feedback input of the voltage regulator. The device may include a ground pin externally coupled to a ground of the circuit, a voltage input pin externally coupled to the voltage output of the voltage regulator, and a plurality of additional pins. Each pin of the plurality of additional pins is externally coupled to a second connection of a corresponding resistor of the plurality of additional resistors. Configuring the device internally to couple the ground pin to a first pin of the plurality of additional pins causes the device to receive a first voltage (e.g., 1.2 volts) at the voltage input pin and configuring the device internally to couple the ground pin to a second pin of the plurality of additional pins causes the device to receive a second voltage (e.g., 1.1 volts) that is different from the first voltage at the voltage input pin. Configuring the device internally to couple the ground pin to a third pin of the plurality of additional pins causes the device to receive, at the voltage input pin, a third voltage (e.g., 0.9 volts) that is different from both the first voltage (e.g., 1.2 volts) and the second voltage (e.g., 1.1 volts). In some cases, the circuit board may be a motherboard of a computing device and the device may be a memory device, such as, for example, a ball grid array (BGA) solid state drive (SSD).

FIG. 1 is a block diagram of a circuit 100 that includes a device that automatically receives an appropriate amount of voltage, according to some embodiments. The circuit 100 include a voltage regulator 102, a voltage divider 104, and a device 106. The device 106 may, for example, be a BGA SSD, or another type of IC device. The device 106 may be manufactured by multiple vendors. For example, a first manufacturer may design a device 106(1), a second manufacturer may design a device 106(2), and a third manufacturer may design a device 106(3).

The voltage regulator 102 may include a Voltage Out (Vout) 108 and an input for a feedback voltage (Vfb) 110. The voltage regular 102 may output a regulated voltage at Vout 108 and receive at least a portion of the regulated voltage, after the fixed voltage goes through resistor 112, at the Vfb 110. The value of the voltage received at feedback 110 is based on a value of the resistor 112. The voltage regulator 102 may determine (e.g., measure) the voltage received at Vfb 110 and adjust (e.g., regulate) the voltage provided at the Vout 108 accordingly. Thus, the voltage provided at Vout 108 may remain relatively constant, e.g., at X volts within a tolerance of Y %, where X>0, and Y<10% of X.

The voltage divider 104 may include a resistor (R) 112, an R 114(1), an R 114(3), and Voltage output (Vout) 116. For each of the devices 106, the Vout 116 of the voltage divider 104 may be connected to a voltage input (Vin) 118. Each of the devices 106 includes three pins 122(1), 122(2), and 122(3). In each of the devices 106, one of the pins 122 may be connected to a ground (GND) 120 while the remaining pins are unconnected (e.g., floating). The grounded one of the pins 122 enables each of the devices 106(1), 106(2), and 106(3) to receive a different amount of voltage from the voltage regulator 102. For example, in the device 106(1), the pin 122(1) may be connected to the GND 120 and the remaining pins (e.g., 122(2) and 122(3)) may be unconnected (e.g., floating), causing Vin 118 to have a first voltage. In the device 106(2), the pin 122(2) may be connected to the GND 120 and the remaining pins (e.g., 122(1) and 122(3)) may be unconnected, causing Vin 118 to have a second voltage that is different from the first voltage. In the device 106(3), the pin 122(3) may be connected to the GND 120 and the remaining pins (e.g., 122(1) and 122(2)) may be unconnected, causing Vin 118 to have a third voltage that is different from the first voltage and from the second voltage.

For example, assume that the device 106(1) uses 1.2V, the device 106(2) uses 1.1V, and the device 106(3) uses 0.9V. Assume the voltage at Vfb 110 is about 0.6V. In this example, R 112 may be about 100 kilo (k) ohms (Ω), R 114(1) may be about 100 kΩ, R 114(2) may be about 120 kΩ, and R 114(1) may be about 200 kΩ, with each of the resistance values having a tolerance of 1% or better (e.g., less than 1%). Using the aforementioned resistance values, the output Vout 116 at the input Vin 118 of the device 106(1) may be about 1.2V, the output Vout 116 at the Vin 118 of the device 106(2) may be about 1.1V, and the output Vout 116 at the Vin 118(3) of the device 106(3) may be about 0.9V. Of course, for different voltages for other vendors, the values of R 112, and R 114 may be adjusted accordingly. For example, the values of each of the resistors R 114 may be determined using the following:

$$R\ 114(N)=(R\ 112\times Vfb\ 110)/(Vout\ 116-Vfb\ 110),$$
where N=1,2, or 3

$$R\ 114(1)=(100\times 0.6)/(1.2-0.6)=100\ k\Omega\ (e.g.,\ Vout\ 116=1.2V)$$

$$R\ 114(2)=(100\times 0.6)/(1.1-0.6)=120\ k\Omega\ (e.g.,\ Vout\ 116=1.1V)$$

$$R\ 114(3)=(100\times 0.6)/(0.9-0.6)=200\ k\Omega\ (e.g.,\ Vout\ 116=0.9V)$$

Thus, placing the device 106(1) in the circuit 100 and applying power results in voltage flowing to GND 120 over R 112 and R 114(1), resulting in a first voltage (e.g., 1.2V) being provided to the device 106(1) at Vin 118. Placing the device 106(2) in the circuit 100 and applying power results in voltage flowing to GND 120 over R 112 and R 114(2), resulting in a second voltage (e.g., 1.1V) being provided to the device 106(2) at Vin 118. Placing the device 106(3) in the circuit 100 and applying power results in voltage flowing to GND 120 over R 112 and R 114(3), resulting in a third voltage (e.g., 0.9V) being provided to the device 106(3) at Vin 118. Thus, placing one of the devices 106(1), 106(2), or 106(3) into the circuit 100 causes the device to be automatically (e.g., without human interaction) configured to receive an appropriate amount of voltage (e.g., 1.2V, 1.1V or 0.9V) at Vin 118 based on which of the pins 122(1), 122(2), or 122(3) is grounded.

Figure 2:
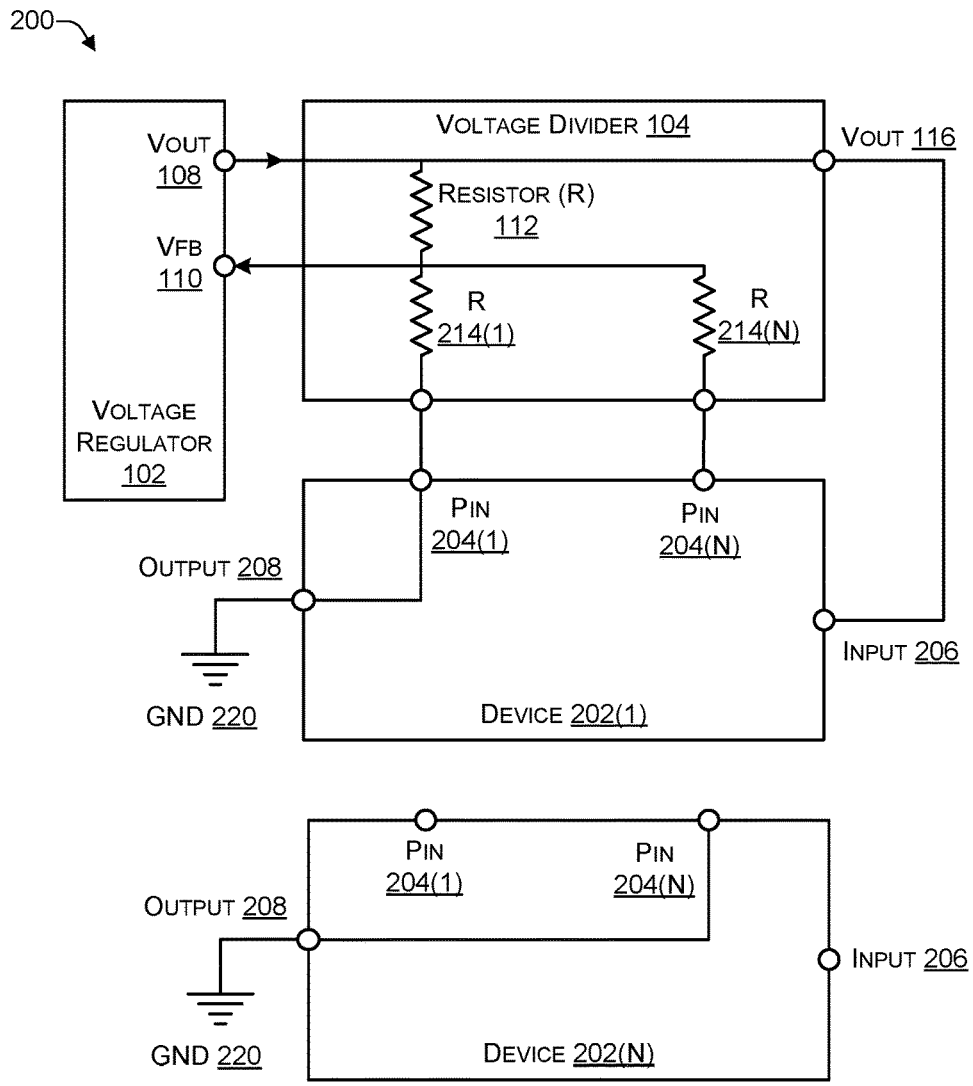
FIG. 2 is a block diagram of a circuit that includes a device that automatically configures itself to receive one of multiple voltages, according to some embodiments.

FIG. 2 is a block diagram of a circuit 200 that includes a device that automatically configures itself to receive one of multiple voltages, according to some embodiments. The circuit 200 expands on the circuit 100 to use N pins to provide N different voltages for N vendors. The circuit 200 may include a device 202 having a plurality of pins, including a pin 204(1) to 204(N) (where N>1), an input 206, and an output 208 connected to a ground (GND) 220. The voltage divider 104 has multiple resistors 214(1) to 214(N).

Each vendor may design the device 202 to have a different one of the pins 204 connected to the output 208 (and to the GND 220) and the remaining of the pins 204 may be unconnected (e.g., floating). Connecting one of the pins 204 to the GND 220 enables each of multiple versions of the device 202 to receive a different amount of voltage from the voltage regulator 102. A first vendor may design the device 202(1) with pin 204(1) connected to GND 220 and the remaining of the pins 204 unconnected, thereby enabling the device 202 to receive a first voltage at the input 206 from Vout 116. An Nth vendor may design the device 202(N) with pin 204(N) connected to GND 220 and the remaining of the pins 204 unconnected, thereby enabling the device 202 to receive an Nth voltage at the input 206 from Vout 116. In this way, N different vendors can design N different devices 202 to receive N different voltages.

For example, assume that the device 106(1) uses 1.2V, the device 106(2) uses 1.1V, and the device 106(3) uses 0.9V. Assume the voltage at Vfb 110 is about 0.6V. In this example, R 112 may be about 100 kilo (k) ohms (Ω), R 114(1) may be about 100 kΩ, R 114(2) may be about 120 kΩ, and R 114(1) may be about 200 kΩ, with each of the resistance values having a tolerance of 1% or better (e.g., less than 1%). Using the aforementioned resistance values, the output at the Vin 118 of the device 106(1) may be about 1.2V, the output at the Vin 118 of the device 106(2) may be about 1.1V, and the output at the Vin 118(3) of the device 106(3) may be about 0.9V. In the circuit 200:

$$R\ 214(N)=(R\ 112\times Vfb\ 100)/(Vout\ 108-Vfb\ 110)$$

Thus, placing the device 106(1) in the circuit 100 and applying power results in voltage flowing to GND 120 over R 112 and R 114(1), resulting in a first voltage (e.g., 1.2V) being provided to the device 106(1) at Vin 118. Placing the device 106(2) in the circuit 100 and applying power results in voltage flowing to GND 120 over R 112 and R 114(2), resulting in a second voltage (e.g., 1.1V) being provided to the device 106(2) at Vin 118. Placing the device 106(3) in the circuit 100 and applying power results in voltage flowing to GND 120 over R 112 and R 114(3), resulting in a third voltage (e.g., 0.9V) being provided to the device 106(3) at Vin 118. Thus, placing one of the devices 106(1), 106(2), or 106(3) into the circuit 100 causes the device to be automatically (e.g., without human interaction) configured to receive an appropriate amount of voltage (e.g., 1.2V, 1.1V or 0.9V) at Vin 118 based on which of the pins 122(1), 122(2), or 122(3) is grounded.

Figure 3:
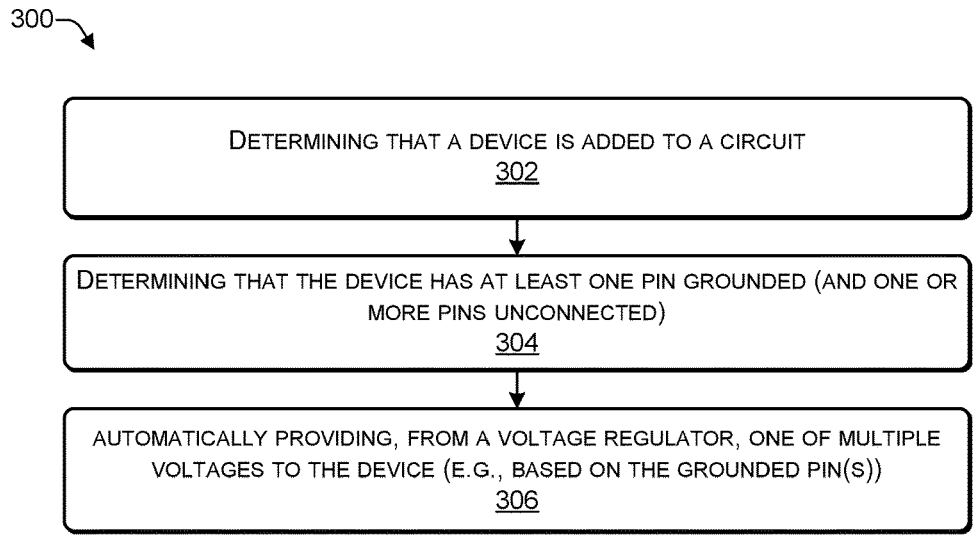
FIG. 3 is a flowchart of a process that includes adding a device to a circuit, according to some embodiments.

In the flow diagram of FIG. 3, each block represents one or more operations that can be implemented in hardware. The order in which the blocks are described is not intended to be construed as a limitation, and any number of the described operations can be combined in any order and/or in parallel to implement the processes. For discussion purposes, the process 300 is described with reference to FIGS. 1 and 2, as described above, although other models, frameworks, systems and environments may be used to implement these processes.

FIG. 3 is a flowchart of a process that includes adding (e.g., connecting) a device to a circuit, according to some embodiments. For example, the process 300 may be performed by a circuit, such as the circuit 100 of FIG. 1 or the circuit 200 of FIG. 2.

At 302, a determination may be made that a device has been added (e.g., connected) to a circuit. For example, in FIG. 1, the circuit 100 may determine that one of the devices 106(1), 106(2), or 106(3) has been added (e.g., connected) to the circuit 100. In FIG. 1, the circuit 200 may determine that one of the devices 202(1) or 202(N) has been added (e.g., connected) to the circuit 200.

At 304, a determination may be made that the device has at least one pin grounded and one or more pins unconnected. For example, in FIG. 1, the circuit 100 may determine which one of the pins 122(1), 122(2), or 122(3) is grounded and which of the remaining pins are unconnected. To illustrate, when the device 106(1) is placed in the circuit 100, the circuit 100 may determine that the pin 122(1) is grounded and the remaining pins (e.g., 122(2) and 122(3)) are unconnected (e.g., floating). When the device 106(2) is placed in the circuit 100, the circuit 100 may determine that the pin 122(1) is grounded and the remaining pins (e.g., 122(1) and 122(3)) are unconnected. When the device 106(3) is placed in the circuit 100, the circuit 100 may determine that the pin 122(3) is grounded and the remaining pins (e.g., 122(1) and 122(2)) are unconnected. In FIG. 2, the circuit 200 may determine which one of the pins 204(1) to 204(N) is grounded and which of the remaining pins are unconnected. To illustrate, when the device 202(N) is placed in the circuit 200, the circuit 200 may determine that the pin 204(N) is grounded and the remaining pins 204 are unconnected (e.g., floating).

At 406, a voltage regulator may automatically (e.g., without human interaction), based on the pin(s) that are grounded, provide one of multiple voltages to the device. For example, in FIG. 1, when the device 106(1) is placed in the circuit 100, the device 106(1) may automatically receive a first voltage (e.g., 1.2V) at Vin 118. When the device 106(2) is placed in the circuit 100, the device 106(2) may automatically receive a second voltage (e.g., 1.1V) at Vin 118. When the device 106(3) is placed in the circuit 100, the device 106(3) may automatically receive a third voltage (e.g., 0.9V) at Vin 118. In FIG. 2, when the device 202(N) is placed in the circuit 200, the device 202(N) may automatically receive an Nth voltage at the input 206.

Thus, when a device is placed in a circuit, the device receives a particular voltage of multiple voltages. The particular voltage may be determined based on which pin one of multiple pins is grounded in the device. In this way, the device auto configures itself to receive an appropriate amount of voltage. For example, a first device designed by a first vendor may automatically receive a first voltage, a second device designed by a second vendor may automatically receive a second voltage, and so on.

Figure 4:
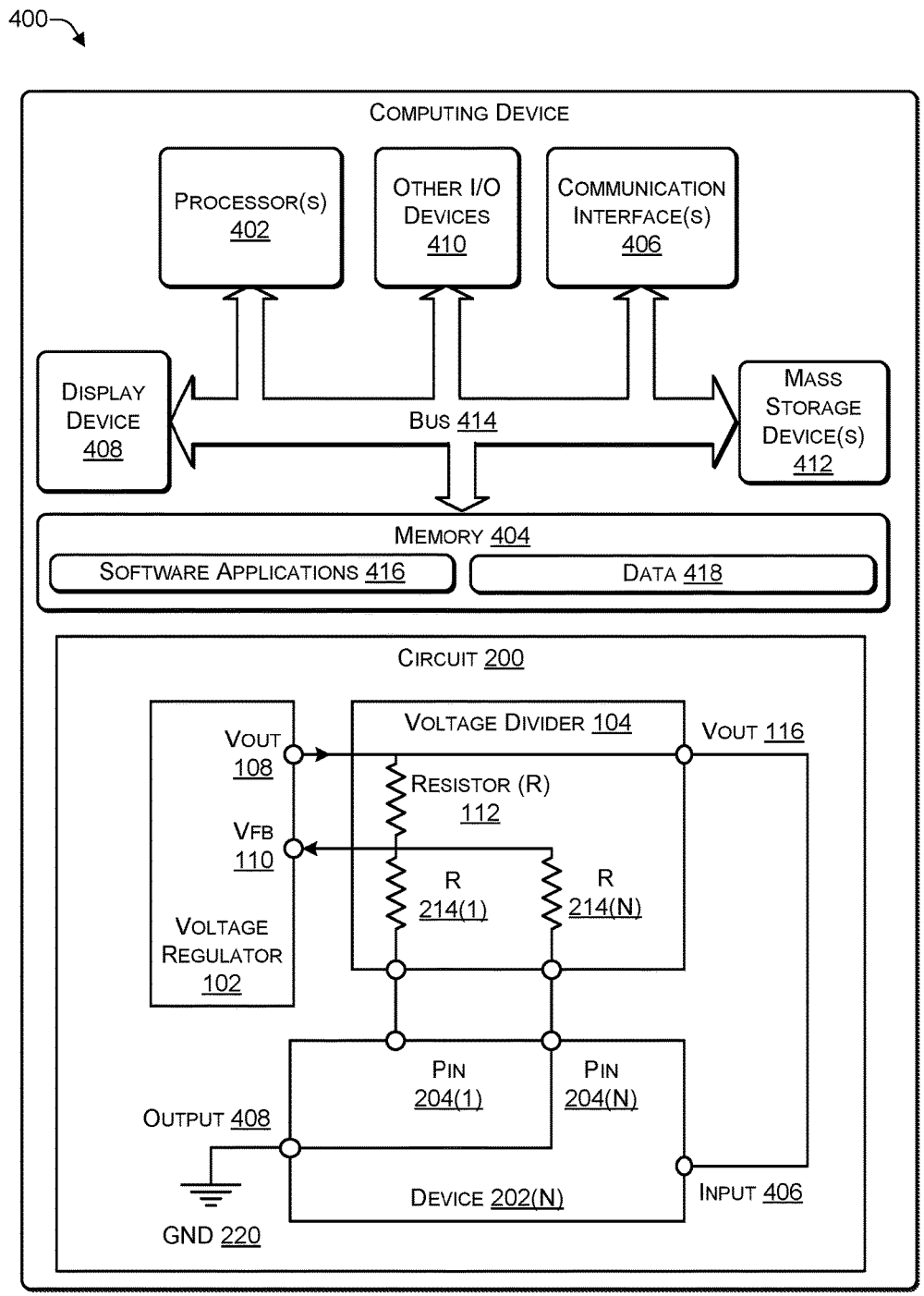
FIG. 4 illustrates an example configuration of a computing device that can be used to implement the systems and techniques described herein.

FIG. 4 illustrates an example configuration of a computing device 400 that can be used to implement the systems and techniques described herein. For example, the computing device 400 may include a circuit board that includes at least one of the circuit 100 of FIG. 1 or the circuit 200 of the FIG. 2.

The computing device 400 may include one or more processors 402 (e.g., CPU, GPU, or the like), a memory 404, communication interfaces 406, a display device 408, other input/output (I/O) devices 410 (e.g., keyboard, trackball, and the like), the sensors 206, and one or more mass storage devices 412 (e.g., disk drive, solid state disk drive, or the like), configured to communicate with each other, such as via one or more system buses 414 or other suitable connections. While a single system bus 414 is illustrated for ease of understanding, it should be understood that the system buses 414 may include multiple buses, such as a memory device bus, a storage device bus (e.g., serial ATA (SATA) and the like), data buses (e.g., universal serial bus (USB) and the like), video signal buses (e.g., ThunderBolt®, DVI, HDMI, and the like), power buses, etc.

The processors 402 are one or more hardware devices that may include a single processing unit or a number of processing units, all of which may include single or multiple computing units or multiple cores. The processors 402 may include a graphics processing unit (GPU) that is integrated into the CPU or the GPU may be a separate processor device from the CPU. The processors 402 may be implemented as one or more microprocessors, microcomputers, microcontrollers, digital signal processors, central processing units, graphics processing units, state machines, logic circuitries, and/or any devices that manipulate signals based on operational instructions. Among other capabilities, the processors 402 may be configured to fetch and execute computer-readable instructions stored in the memory 404, mass storage devices 412, or other computer-readable media.

Memory 404 and mass storage devices 412 are examples of computer storage media (e.g., memory storage devices) for storing instructions that can be executed by the processors 402 to perform the various functions described herein. For example, memory 404 may include both volatile memory and non-volatile memory (e.g., RAM, ROM, or the like) devices. Further, mass storage devices 412 may include hard disk drives, solid-state drives, removable media, including external and removable drives, memory cards, flash memory, floppy disks, optical disks (e.g., CD, DVD), a storage array, a network attached storage, a storage area network, or the like. Both memory 404 and mass storage devices 412 may be collectively referred to as memory or computer storage media herein and may be any type of non-transitory media capable of storing computer-readable, processor-executable program instructions as computer program code that can be executed by the processors 402 as a particular machine configured for carrying out the operations and functions described in the implementations herein. The memory 404 may be implemented using one or more devices, such as the device 106 of FIG. 1 or the device 202 of FIG. 2.

The computing device 400 may include one or more communication interfaces 406 for exchanging data via the network 106. The communication interfaces 406 can facilitate communications within a wide variety of networks and protocol types, including wired networks (e.g., Ethernet, DOCSIS, DSL, Fiber, USB etc.) and wireless networks (e.g., WLAN, GSM, CDMA, 802.11, Bluetooth, Wireless USB, ZigBee, cellular, satellite, etc.), the Internet and the like. Communication interfaces 406 can also provide communication with external storage, such as a storage array, network attached storage, storage area network, cloud storage, or the like.

The display device 408 may be used for displaying content (e.g., information and images) to users. Other I/O devices 410 may be devices that receive various inputs from a user and provide various outputs to the user, and may include a keyboard, a touchpad, a mouse, a printer, audio input/output devices, and so forth.

The computer storage media, such as memory 404 and mass storage devices 412, may be used to store software and data. For example, the computer storage media may be used to store software applications 416 (including an operating system and device drivers) and data 418.

The example systems and computing devices described herein are merely examples suitable for some implementations and are not intended to suggest any limitation as to the scope of use or functionality of the environments, architectures and frameworks that can implement the processes, components and features described herein. Thus, implementations herein are operational with numerous environments or architectures, and may be implemented in general purpose and special-purpose computing systems, or other devices having processing capability. Generally, any of the functions described with reference to the figures can be implemented using software, hardware (e.g., fixed logic circuitry) or a combination of these implementations. The term "module," "mechanism" or "component" as used herein generally represents software, hardware, or a combination of software and hardware that can be configured to implement prescribed functions. For instance, in the case of a software implementation, the term "module," "mechanism" or "component" can represent program code (and/or declarative-type instructions) that performs specified tasks or operations when executed on a processing device or devices (e.g., CPUs or processors). The program code can be stored in one or more computer-readable memory devices or other computer storage devices. Thus, the processes, components and modules described herein may be implemented by a computer program product.

Furthermore, this disclosure provides various example implementations, as described and as illustrated in the drawings. However, this disclosure is not limited to the implementations described and illustrated herein, but can extend to other implementations, as would be known or as would become known to those skilled in the art. Reference in the specification to "one implementation," "this implementation," "these implementations" or "some implementations" means that a particular feature, structure, or characteristic described is included in at least one implementation, and the appearances of these phrases in various places in the specification are not necessarily all referring to the same implementation.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A circuit comprising:
    a voltage regulator comprising a voltage output and a feedback input;
    a voltage divider coupled to the voltage regulator, the voltage divider comprising a resistor and a plurality of additional resistors, wherein:
        a first connection of the resistor is coupled to the voltage output;
        a second connection of the resistor is coupled to the feedback input of the voltage regulator;
        a first connection of each of the plurality of additional resistors is coupled to the feedback input of the voltage regulator;
    a device comprising:
        a ground pin externally coupled to a ground of the circuit;
        a voltage input pin externally coupled to the voltage output of the voltage divider; and
        a plurality of additional pins, wherein each pin of the plurality of additional pins is externally coupled to a second connection of a corresponding resistor of the plurality of additional resistors;
        wherein the device is configured internally to couple the ground pin to a particular pin of the plurality of additional pins.

2. The circuit of claim 1, wherein the device is configured internally to:
    couple the ground pin to a first pin of the plurality of additional pins to receive a first voltage, wherein at least a second pin and a third pin of the plurality of pins are unconnected.

3. The circuit of claim 1, wherein the device is configured internally to:
    couple the ground pin to a second pin of the plurality of additional pins to receive a second voltage, wherein at least a first pin and a third pin of the plurality of pins are unconnected.

4. The circuit of claim 1, wherein the device is configured internally to:
    couple the ground pin to a third pin of the plurality of additional pins to receive a third voltage, wherein at least a first pin and a second pin of the plurality of pins are unconnected.

5. The circuit of claim 1, wherein a particular resistor of the plurality of resistors is determined by:
    multiplying a resistance value of the resistor by an amount of feedback voltage at the feedback input, divided by
    a result of subtracting the amount of feedback voltage from the voltage output of the voltage regulator.

6. The circuit of claim 1, wherein the device comprises a memory device.

7. The circuit of claim 1, wherein the device comprises a ball grid array (BGA) solid state drive (SSD).

8. A motherboard comprising:
    one or more processors;
    a voltage regulator comprising a voltage output and a feedback input;
    a voltage divider coupled to the voltage regulator, the voltage divider comprising a resistor and a plurality of additional resistors, wherein:
        a first connection of the resistor is coupled to the voltage output;
        a second connection of the resistor is coupled to the feedback input of the voltage regulator;
        a first connection of each of the plurality of additional resistors is coupled to the feedback input of the voltage regulator;
    a memory device comprising:
        a ground pin externally coupled to a ground of the circuit;
        a voltage input pin externally coupled to the voltage output of the voltage divider; and
        a plurality of additional pins, wherein each pin of the plurality of additional pins is externally coupled to a second connection of a corresponding resistor of the plurality of additional resistors;
            wherein the memory device is configured internally to couple the ground pin to a particular pin of the plurality of additional pins.

9. The motherboard of claim 8, wherein:
    the memory device is configured internally to couple the ground pin to a first pin of the plurality of additional pins to receive a first voltage at the voltage input pin from the voltage regulator.

10. The motherboard of claim 9, wherein:
    a first resistor of the plurality of resistors has a resistance of about 100 kilo ohms; and
    the first voltage comprises about 1.2 volts.

11. The motherboard of claim 8, wherein:
    the memory device is configured internally to couple the ground pin to a second pin of the plurality of additional pins to receive a second voltage at the voltage input pin from the voltage regulator.

12. The motherboard of claim 11, wherein:
    a second resistor of the plurality of resistors has a resistance of about 120 kilo ohms; and
    the second voltage comprises about 1.1 volts.

13. The motherboard of claim 12, wherein:
    the memory device is configured internally to couple the ground pin to a third pin of the plurality of additional pins to receive a third voltage at the voltage input pin from the voltage regulator.

14. A circuit board comprising:
a voltage regulator comprising a voltage output and a feedback input;
a voltage divider coupled to the voltage regulator, the voltage divider comprising a resistor and a plurality of additional resistors, wherein:
 a first connection of the resistor is coupled to the voltage output;
 a second connection of the resistor is coupled to the feedback input of the voltage regulator;
 a first connection of each of the plurality of additional resistors is coupled to the feedback input of the voltage regulator;
a device comprising:
 a ground pin externally coupled to a ground of the circuit;
 a voltage input pin externally coupled to the voltage output of the voltage divider; and
 a plurality of additional pins, wherein each pin of the plurality of additional pins is externally coupled to a second connection of a corresponding resistor of the plurality of additional resistors;
wherein:
 configuring the device internally to couple the ground pin to a first pin of the plurality of additional pins causes the device to receive a first voltage at the voltage input pin; and
 configuring the device internally to couple the ground pin to a second pin of the plurality of additional pins causes the device to receive a second voltage that is different from the first voltage at the voltage input pin.

15. The circuit board of claim 14, wherein:
the first voltage comprises about 1.2 volts.

16. The circuit board of claim 14, wherein:
the second voltage comprises about 1.1 volts.

17. The circuit board of claim 14, wherein:
configuring the device internally to couple the ground pin to a third pin of the plurality of additional pins causes the device to receive, at the voltage input pin, a third voltage that is different from both the first voltage and the second voltage.

18. The circuit board of claim 17, wherein the third voltage comprises about 0.9 volts.

19. The circuit board of claim 14, wherein:
the circuit board comprises a motherboard of a computing device; and
the device comprises a memory device.

20. The circuit board of claim 14, wherein the device comprises a ball grid array (BGA) solid state drive (SSD).

* * * * *